United States Patent
Anandaiah Shetty Nagaraja

(10) Patent No.: US 10,620,259 B2
(45) Date of Patent: Apr. 14, 2020

(54) METHOD AND SYSTEM FOR FACILITATING FAULT RECTIFICATION IN POWER BACKUP DEVICES

(71) Applicant: WIPRO LIMITED, Bangalore (IN)

(72) Inventor: Kothamangala Anandaiah Shetty Nagaraja, Mulbagal (IN)

(73) Assignee: Wipro Limited, Bangalore (IN)

( * ) Notice: Subject to any disclaimer, the term of this patent is extended or adjusted under 35 U.S.C. 154(b) by 478 days.

(21) Appl. No.: 15/646,557

(22) Filed: Jul. 11, 2017

(65) Prior Publication Data

US 2018/0340973 A1    Nov. 29, 2018

(30) Foreign Application Priority Data

May 25, 2017    (IN) .............................. 201741018394

(51) Int. Cl.
*G01R 31/28* (2006.01)
*H02J 9/04* (2006.01)
(Continued)

(52) U.S. Cl.
CPC ............ *G01R 31/2836* (2013.01); *H02J 9/04* (2013.01); *G01R 31/40* (2013.01); *H02J 9/00* (2013.01)

(58) Field of Classification Search
CPC .................... H02J 9/04–08; G01R 31/2836
See application file for complete search history.

(56) References Cited

U.S. PATENT DOCUMENTS

2004/0225648 A1   11/2004  Ransom et al.
2008/0215302 A1    9/2008  Nasle et al.
(Continued)

FOREIGN PATENT DOCUMENTS

| | | |
|---|---|---|
| CN | 203658816 | 6/2014 |
| CN | 104122832 | 10/2014 |
| CN | 104237807 | 12/2014 |

OTHER PUBLICATIONS

Smart-UPS-APC—United States, Intelligent and efficient power protection for entry level to scaleable runtime. Ideal UPS for servers, point-of-sale, routers, switches, hubs and other network devices, abstract http://www.apc.com/shop/us/en/catergories/power/ups/network-and-server/smart-ups/_N-1h89yke, 2017, *APC*, 1-3 pages.
(Continued)

*Primary Examiner* — Thienvu V Tran
*Assistant Examiner* — Christopher J Clark
(74) *Attorney, Agent, or Firm* — Finnegan, Henderson, Farabow, Garrett & Dunner, LLP

(57) ABSTRACT

Disclosed herein is method and system for facilitating fault rectification in power backup devices using a fault rectification system configured in the power backup device. The fault rectification system detects occurrence of fault events in the power backup device and retrieves information required for rectification of the fault events based on the complexity level of the fault event. The rectification information is provided to the user, thereby facilitating the user in rectification of the detected fault event, without requirement of the expert service personnel. The method of instant disclosure helps in reducing total turnaround time of rectifying the faults in the power backup devices by eliminating involvement of expert/customer service personnel in the rectification of the faults.

12 Claims, 6 Drawing Sheets

(51) Int. Cl.
*H02J 9/00* (2006.01)
*G01R 31/40* (2020.01)

(56) References Cited

U.S. PATENT DOCUMENTS

| 2009/0240377 | A1* | 9/2009 | Batzler | G06Q 10/06 |
| | | | | 700/287 |
| 2013/0069667 | A1* | 3/2013 | Beg | G06F 1/263 |
| | | | | 324/512 |
| 2018/0241245 | A1* | 8/2018 | Ret | H02J 9/06 |

OTHER PUBLICATIONS

Dell Smart-UPS Line Interactive—Dell India, abstract http://www.dell.com/in/business/p/ups/pd, 2017, *Dell*, 1 page.

* cited by examiner

Display interface 107

Problem: UPS is not turning on

Detected fault event: UPS is tripped

Fault rectification information:

1. Locate the Trip 'Reset' button on the UPS

2. Press the 'Reset' button inward and move to step 5

3. If the 'Reset' button is already pressed, confirm that AC outlet has power by connecting a lamp/other device 4. If AC outlet has no power, keep the UPS for charging for 4-6 hours 5. Long press the 'Power' button until the UPS turns on with a beep sound Contact the Customer Service @ 10-000-1808 if the problem persists.

FIG. 3A

Display interface 107

Problem: Battery is not getting charged

Detected fault event: Battery is dead / Fuses are melted

Fault rectification information:

1. Contact the Customer Service @ 10-000-1808 for replacing the battery / fuses.

FIG. 3B

METHOD AND SYSTEM FOR FACILITATING FAULT RECTIFICATION IN POWER BACKUP DEVICES

TECHNICAL FIELD

The present subject matter is related, in general to power backup devices and more particularly, but not exclusively to a method and system for facilitating fault rectification in power backup devices.

BACKGROUND

To maintain uninterrupted supply of electricity across houses, shops, or any locations, it is a general practice to use power backup and storage systems such as Uninterrupted Power Supplies (UPS), Inverters, Large-scale generators, and the like. However, when the power backup systems themselves break down due to any reason, a user/customer must immediately contact a service center or an authorized supplier of the power backup systems to rectify issues in the power backup systems, irrespective of whether the issue is simple or critical.

More often, the process of communicating the issues occurred in the power backup systems to the concerned personnel such as customer care service, a site visiting service engineer etc., takes a lot of time. Further, this turnaround time would be same irrespective of whether the issues are simple or critical. Consequently, a user of the power backup system may have to suffer from longer delays even when the issues causing break down of the power backup systems are simple and does not actually require attention from expert service staff.

Although there are smart power backup systems available currently, the features available in these smart power backup systems are limited to remote accessing, remote controlling, event detection, error notification on control panel and the like. Thus, none of the existing power backup devices assist a user in rectifying the issues before contacting the expert service staff.

SUMMARY

Disclosed herein is a method of facilitating fault rectification in power backup devices. The method includes detecting, by a fault rectification system configured in the power backup device, occurrence of a fault event in the power backup device and complexity level of the detected fault event based on one or more pre-configured interrupts. Further, a fault identifier query corresponding to the detected fault event is generated when the complexity level of the detected fault event is less than a predetermined complexity level. Upon generating the fault identifier query, fault rectification information corresponding to the fault identifier query are retrieved from one or more data sources, associated with the power backup device. The fault rectification information includes information related to rectification of the fault event. Finally, the fault rectification information retrieved from the one or more data sources are provided to one or more users of the power backup devices for facilitating fault rectification in the power backup devices.

Further, the present disclosure relates to a fault rectification system for facilitating fault rectification in power backup devices. The fault rectification system comprises a processor and a memory communicatively coupled to the processor. The memory stores processor-executable instructions, which, on execution, causes the processor to detect occurrence of a fault event in the power backup device and complexity level of the detected fault event based on one or more pre-configured interrupts. Further, the instructions cause the processor to generate a fault identifier query corresponding to the detected fault event when the complexity level of the detected fault event is less than a predetermined complexity level. Upon generating the fault identifier query, the processor retrieves fault rectification information corresponding to the fault identifier query from one or more data sources, associated with the power backup device, wherein the fault rectification information comprises information related to rectification of the fault event. Finally, the instructions cause the processor to provide the retrieved fault rectification information to one or more users of the power backup devices for facilitating fault rectification in the power backup devices.

Furthermore, the present disclosure relates to a non-transitory computer readable medium including instructions stored thereon, that when processed by at least one processor, cause a fault rectification system to perform operations comprising detection of occurrence of a fault event in the power backup device and complexity level of the detected fault event based on one or more pre-configured interrupts. Subsequently, the instructions cause the processor to generate a fault identifier query corresponding to the detected fault event when the complexity level of the detected fault event is less than a predetermined complexity level. Upon generating the fault identifier query, the instructions cause the processor to retrieve fault rectification information corresponding to the fault identifier query from one or more data sources associated with the power backup device. The fault rectification information comprises information related to rectification of the fault event. Finally, the instructions cause the processor to provide the retrieved fault rectification information to one or more users of the power backup device for facilitating fault rectification in the power backup device.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF DRAWINGS

The accompanying drawings, which are incorporated in and constitute a part of this disclosure, illustrate exemplary embodiments and, together with the description, explain the disclosed principles. In the figures, the left-most digit(s) of a reference number identifies the figure in which the reference number first appears. The same numbers are used throughout the figures to reference like features and components. Some embodiments of system and/or methods in accordance with embodiments of the present subject matter are now described, by way of example only, and regarding the accompanying figures, in which:

FIGS. 3A and 3B show exemplary illustration of display interface of the fault rectification system in accordance with some embodiments of the present disclosure;

Figure 1:
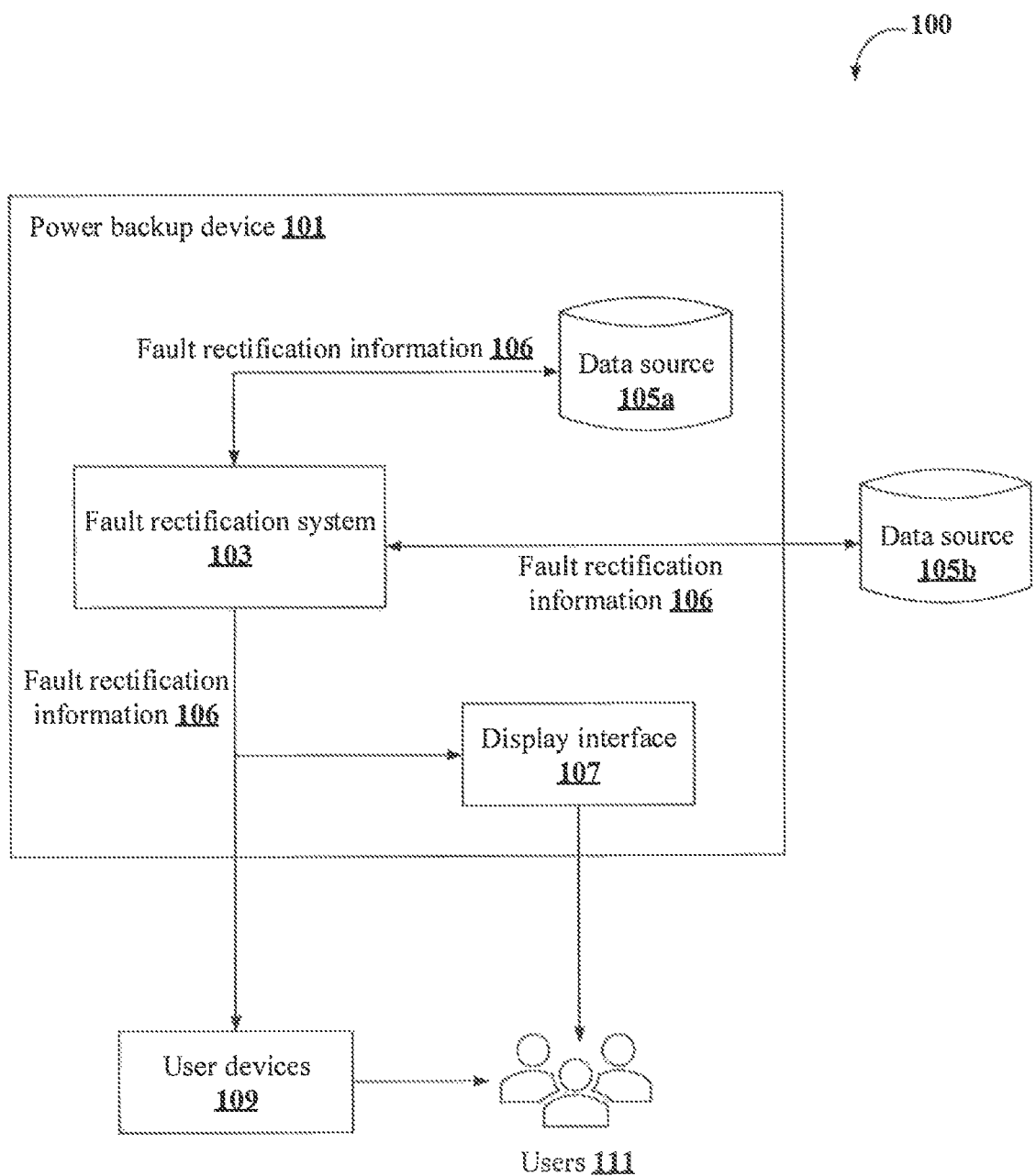
FIG. 1 shows an exemplary environment for facilitating fault rectification in power backup devices in accordance with some embodiments of the present disclosure.

It should be appreciated by those skilled in the art that any block diagrams herein represent conceptual views of illustrative systems embodying the principles of the present subject matter. Similarly, it will be appreciated that any flow charts, flow diagrams, state transition diagrams, pseudo code, and the like represent various processes which may be substantially represented in computer readable medium and executed by a computer or processor, whether such computer or processor is explicitly shown.

DETAILED DESCRIPTION

In the present document, the word "exemplary" is used herein to mean "serving as an example, instance, or illustration." Any embodiment or implementation of the present subject matter described herein as "exemplary" is not necessarily to be construed as preferred or advantageous over other embodiments.

While the disclosure is susceptible to various modifications and alternative forms, specific embodiment thereof has been shown by way of example in the drawings and will be described in detail below. It should be understood, however that it is not intended to limit the disclosure to the specific forms disclosed, but on the contrary, the disclosure is to cover all modifications, equivalents, and alternative falling within the spirit and the scope of the disclosure.

The terms "comprises", "comprising", "includes", or any other variations thereof, are intended to cover a non-exclusive inclusion, such that a setup, device or method that comprises a list of components or steps does not include only those components or steps but may include other components or steps not expressly listed or inherent to such setup or device or method. In other words, one or more elements in a system or apparatus proceeded by "comprises . . . a" does not, without more constraints, preclude the existence of other elements or additional elements in the system or method.

The present disclosure relates to a method and a fault rectification system for facilitating fault rectification in power backup devices. The fault rectification system may be configured in the power backup devices. Initially, the fault rectification system detects occurrence of a fault event in the power backup devices based on one or more pre-configured interrupts. In an embodiment, the one or more pre-configured interrupts are raised in response to occurrence of one or more faults in the power backup devices. Upon detecting the occurrence of the one or more faults, the fault rectification system may determine the type of error correction processing that must be used to rectify the detected faults based on complexity level of the detected faults. In an embodiment, the complexity level of the faults may be determined based on predefined complexity scores associated with each of the one or more faults.

Further, upon determining the complexity level of faults, the fault rectification may automatically generate a fault rectification query corresponding to the detected fault for automatically querying a local and/or remote data source for retrieving fault rectification information required for rectifying the detected faults. Later, the retrieved fault rectification information may be automatically presented on a display interface in the power backup device or on one or more hand held devices associated with users of the power backup devices. Thereafter, the users may rectify the faults in the power backup devices using the fault rectification information provided to them.

In some embodiments, the fault rectification information may be stored within a local memory of the fault rectification system and may be used when the same/similar faults occur repeatedly. Alternatively, the fault rectification information may be stored on a remote server and may be retrieved when same or similar fault identifier queries are received from the fault rectification system. Therefore, the fault rectification system facilitates the users in rectifying faults in the power backup devices without intervention of expert service personnel, thereby reducing total turnaround time required for rectifying the faults in the power backup devices.

In the following detailed description of the embodiments of the disclosure, reference is made to the accompanying drawings that form a part hereof, and in which are shown by way of illustration specific embodiments in which the disclosure may be practiced. These embodiments are described in sufficient detail to enable those skilled in the art to practice the disclosure, and it is to be understood that other embodiments may be utilized and that changes may be made without departing from the scope of the present disclosure. The following description is, therefore, not to be taken in a limiting sense.

FIG. 1 shows an exemplary environment for facilitating fault rectification in power backup device 101 using a fault rectification system 103 in accordance with some embodiments of the present disclosure.

The environment 100 may include a power backup device 101. As an example, the power backup device 101 may include, without limiting to, an Uninterrupted Power Supply (UPS) system, a power Inverter, an emergency power system, or a standby generator, which is used by one or more users 111 as a backup power source to the regular power supplies. In an implementation, the fault rectification system 103 may be configured in the power backup device 101 for continuously monitoring status of the power backup device 101 and to detect occurrence of a fault event in the power backup device 101. As an example, a fault may include, without limiting to, loosened or improper connections of connector cables, power fluctuations, corrupt fuse or circuit breakers, battery drain out, over heating of the power backup device 101 and the like. In some implementations, the fault rectification system 103 may notify the one or more users 111 about occurrence of the fault event through one or more preconfigured user devices 109 associated with the one or more users 111 or by displaying suitable information on a display interface 107 associated with the power backup device 101.

In some embodiments, upon detecting the occurrence of the fault event in the power backup device 101, the fault rectification system 103 may dynamically determine complexity level of the detected fault event. Further, based on the complexity level of the detected fault event, the fault rectification system 103 may determine whether the detected fault event is rectifiable locally by the one or more users 111 themselves or it requires assistance from the expert service personnel. If the detected fault event is determined to be simple and locally rectifiable, then the fault rectification system 103 may generate a fault identifier query corresponding to the detected fault event. As an example, the fault identifier query may be an inquiry into one or more data sources 105 to fetch fault rectification information 106 corresponding to the detected fault event from the one or more data sources 105. Further, if the detected fault event is determined to be complex or not rectifiable locally by the one or more users 111, then the fault rectification system 103 may notify the one or more users 111 to contact customer service personnel for assistance in rectifying the detected fault events.

The one or more data sources 105 may be databases that store information related to most probable causes for occurrence of the fault events, along with details on how to rectify each fault events. In some implementations, the one or more data sources 105 may be integrated locally within the fault rectification system 103 in the form of stored databases (internal data sources are indicated as data source 105a in FIG. 1). In other implementations, the one or more data sources 105 may be external to the fault rectification system 103 and may be accessed remotely by the fault rectification system 103 using at least one of a wired and/or a wireless communication network (external data sources are indicated as data source 105b in FIG. 1). In an embodiment, the data source 105b may correspond to databases present over the Internet, such as database of the manufacturer of the power backup device 101, tech repository containing multimedia files elucidating solutions for problems encountered in the realm of power backup, and the like.

In some embodiments, upon retrieving the fault rectification information 106 from the one or more data sources 105, the fault rectification system 103 may provide the retrieved fault rectification information 106 to the one or more users 111. As an example, the fault rectification information 106 may be in the form of video tutorials, audio tutorials, or graphical animations which would assist the one or more users 111 in rectifying the fault events. In some implementations, the fault rectification information 106 may be displayed on the display interface 107. Additionally, the fault rectification information 106 may be provided to the one or more users 111 through one or more preconfigured user devices 109 associated with the one or more users 111. Using the fault rectification information 106, the one or more users 111 may rectify the detected fault events. Further, if the one or more users 111 are not in the vicinity of the power backup device 101, the fault rectification system 103 may automatically identify other users within the vicinity of the power backup device 101 to notify and present the fault rectification information 106. In an embodiment, presence of the one or more users 111 in the vicinity of the power backup device 101 may be identified by checking proximity of one or more user devices 109 associated with the one or more users 111 to the power backup device 101. In another embodiment, the fault rectification system 103 may be communicatively connected with a wearable device such as, a smart watch of the one or more users 111. Further, the fault rectification system 103 may automatically render the fault rectification information 106 to the one or more users 111 through the wearable device when the one or more users 111 are in the vicinity of the power backup device 101.

Here, before notifying the fault rectification information 106 to the one or more users 111, the fault rectification system 103 may detect the complexity level of the fault events to determine whether the detected fault events are rectifiable locally by the users 111 themselves or it requires assistance from the expert service personnel.

Figure 2:
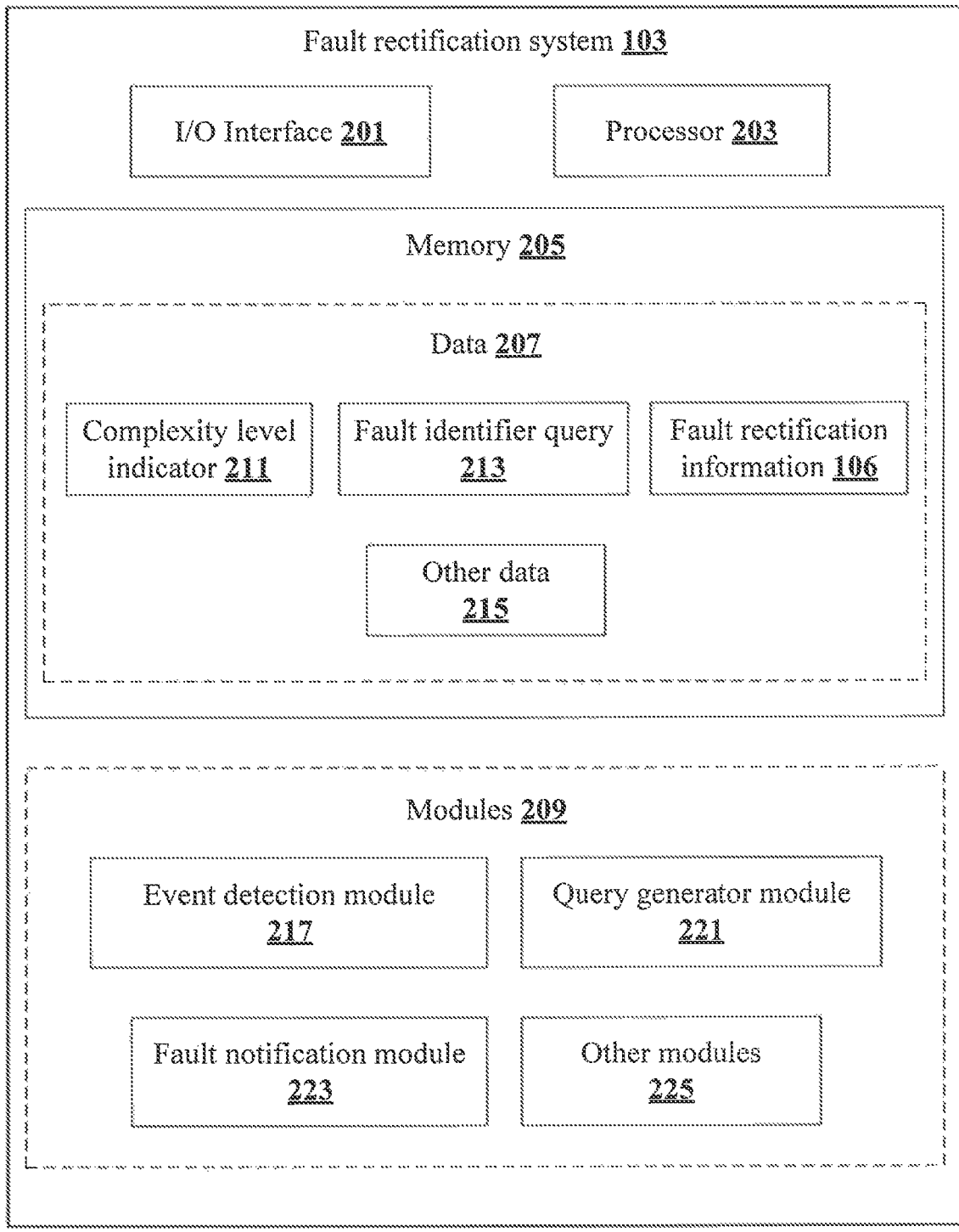
FIG. 2 shows a detailed block diagram illustrating a fault rectification system for facilitating fault rectification in the power backup devices in accordance with some embodiments of the present disclosure.

FIG. 2 shows a detailed block diagram illustrating the fault rectification system 103 for facilitating fault rectification in the power backup device 101 in accordance with some embodiments of the present disclosure.

The fault rectification system 103 may include an Input/Output (I/O) interface 201, a processor 203 and a memory 205. The I/O interface 201 may be configured to communicate with the one or more data sources 105 to retrieve fault rectification information 106 corresponding to the detected fault event. Further, the I/O interface 201 may be used for transmitting the retrieved fault rectification information 106 to the one or more preconfigured user devices 109 associated with the one or more users 111. The memory 205 may be communicatively coupled to the processor 203. The processor 203 may be configured to perform one or more functions of the fault rectification system 103 for facilitating the one or more users 111 in rectification of fault events in the power backup device 101. In one implementation, the fault rectification system 103 may include data 207 and modules 209 for performing various operations in accordance with the embodiments of the present disclosure. In an embodiment, the data 207 may be stored within the memory 205 and may include, without limiting to, a complexity level indicator 211, the fault identifier query 213, the fault rectification information 106, and other data 215.

In some embodiments, the data 207 may be stored within the memory 205 in the form of various data structures. Additionally, the data 207 may be organized using data models, such as relational or hierarchical data models. The other data 215 may store data, including temporary data and temporary files, generated by the modules 209 for performing the various functions of the fault rectification system 103.

In an embodiment, the complexity level indicator 211 may be a numeric value associated with the fault events, and indicates a degree/measure of the complexity of the fault events. As an example, the complexity level indicator 211 may be a numeric value within a range of values '1-5', wherein '1' indicates a simple fault event and '5' indicates a most complex fault event. In an embodiment, each probable fault event that could possibly occur in the power backup device 101, may be associated with a predetermined complexity level indicator 211 based on amount of time and resources required for rectifying each of the fault events. Later, when a fault event is detected in the power backup device 101, the fault rectification system 103 may compare the detected fault event with each of the probable fault events to identify a similar fault event that matches with the detected fault event. Finally, the complexity level of the detected fault event may be determined based on the complexity level associated with the identified similar probable fault event.

The fault identifier query 213 may be used to retrieve fault rectification information 106 related to the detected fault event from the one or more data sources 105. In some embodiments, the fault identifier query 213 may include name of the component or a probable cause of the fault event as a keyword to indicate nature of the detected fault event. Later, the appropriate fault rectification information 106 may be retrieved from the one or more data sources 105 based on the keyword in the fault identifier query 213. As an example, when there is an event of fault related to improper function of Battery of the power backup device 101, the corresponding fault identifier query 213 generated by the fault rectification system 103 may be as following:

FaultDetected: #01—Battery;

Once the above fault identifier query 213 is generated, the fault rectification system 103 uses the fault identifier query 213 to retrieve appropriate fault rectification information 106 corresponding to the fault identifier query 213 from the one or more data sources 105.

In an embodiment, the fault rectification information 106 may include necessary details that would facilitate the one or more users 111 to rectify the detected fault event. As an example, the fault rectification information 106 corresponding to the above fault identifier query 213 may include a list of most likely causes for improper functioning of the Battery, along with most appropriate rectification methods to correct the detected fault event. In some embodiments, the fault rectification information 106 may be provided in various forms including documentary instructions, audio tutorials, video representations or graphical/animation based tutorials. An exemplary illustration of the fault rectification information 106 received from the one or more data sources 105 is depicted in FIGS. 3A and 3B with relevant explanations in the below sections.

In some embodiments, the data 207 may be processed by the modules 209 of the fault rectification system 103. In one implementation, the modules 209 may be stored as a part of the processor 203. In another implementation, the modules 209 may be communicatively coupled to the processor 203 for performing one or more functions of the fault rectification system 103. The modules 209 may include, without limiting to, an event detection module 217, a query generator module 221, a fault notification module 223, and other modules 225.

As used herein, the term module refers to an application specific integrated circuit (ASIC), an electronic circuit, a processor (shared, dedicated, or group) and memory that execute one or more software or firmware programs, a combinational logic circuit, and/or other suitable components that provide the described functionality. In some embodiments, the other modules 225 may be used to perform various miscellaneous functionalities of the fault rectification system 103. It will be appreciated that the modules 209 may be represented as a single module or a combination of different modules.

The event detection module 217 may be responsible for detecting the occurrence of the fault events in the power backup device 101. In an embodiment, each probable fault event may be associated with predetermined interrupts, such that, the predetermined interrupts are raised as soon as the associated fault events originate in the power backup device 101. In some implementations, the event detection module 217 may be configured to continuously monitor status of the power backup device 101 and to detect whenever the predetermined interrupts are raised. Further, the event detection module 217 detects the fault event which is responsible for the predetermined interrupts.

The query generator module 221 may be responsible for generating a fault identifier query 213 corresponding to the detected fault event. In an embodiment, the query generator module 221 may generate the fault identifier query 213 based on numerous factors including, without limiting to, historical information related to the detected fault event, type of the detected fault event, and fault rectification information 106 previously provided to the one or more users 111 for a similar fault event. Further, the query generator module 221 may apply one or more machine learning techniques on available information related to the detected fault event to form an appropriate query relating to the detected fault event.

In some implementations, the query generator module 221 may be interfaced with the one or more data sources 105 to transmit the one or more fault identifier queries to the one or more data sources 105. Further, the query generator module 221 may be configured to generate fault identifier queries in various standard query languages including, without limiting to, any Scripted Query Language (SQL) or non-SQLs, as depending on the configurations at the one or more data sources 105. The one or more data sources 105 execute the fault identifier query 213 and return the corresponding fault rectification information 106 to the fault rectification system 103.

In an embodiment, the query generator module 221 may generate the fault identifier query 213 only when the complexity level associated with the detected fault event is less than the predetermined complexity levels. On the other hand, if the complexity level of the detected fault event is higher than the predetermined complexity level, then the one or more users 111 are notified to contact the customer service personnel for rectification of the detected fault event.

The fault notification module 223 may be responsible for providing the fault rectification information 106 received from the one or more databases to the one or more users 111 of the power backup device 101. In some implementations, the fault notification module 223 may be responsible for displaying the fault rectification information 106 on the display interface 107 of the power backup device 101. The one or more users 111 may follow the fault rectification information 106 displayed on the display interface 107 for rectification of the detected fault event. In an implementation, the fault notification module 223 may provide the fault rectification information 106 to the one or more users 111 through one or more preconfigured user devices 109 associated with the one or more users 111.

As an example, the fault rectification information 106 may be transmitted to the one or more preconfigured user devices 109 as a Short Message Service (SMS) or as an e-mail using pre-stored contact credentials of the other. Also, the fault notification module 223 may use any wireless communication interfaces such as, Bluetooth or Wi-Fi to transmit the fault rectification information 106 to the one or more users 111 who are located within the range/vicinity of the power backup device 101. In some embodiments, if none of the preconfigured user devices 109 are within the vicinity of the power backup device 101, then the fault notification module 223 may automatically transmit the fault rectification information 106 to one or more users 111 who are available within the vicinity of the power backup device 101.

FIGS. 3A and 3B show exemplary illustration of display interface 107 of the fault rectification system 103 in accordance with some embodiments of the present disclosure.

Consider an Uninterrupted Power Supply (UPS) device which is configured with a fault rectification system 103 and being used by a user 'A' as a power backup device 101. Now, suppose the UPS has a fault and does not instantaneously turn on when the main power supply goes off. Here, the user 'A' may not be aware of factors which are causing the above fault. However, by continuously monitoring the status of the UPS and tracking all the interrupts raised in the UPS, the fault rectification system 103 may identify that the fault which is responsible for improper functioning of the UPS is related to 'Tripping in UPS'. Further, the fault rectification system 103 determines the complexity level of rectifying the Tripped UPS and notifies the user 'A' about the complexity of the detected fault event. For example, say, the complexity level of rectifying tripping in the UPS is low.

Here, since the complexity level of the detected fault event is low, the fault rectification system 103 generates the fault identifier query 213 corresponding to the detected fault event and transmits the generated fault identifier query 213 to the one or more data sources 105. The one or more data sources 105 execute the fault identifier query 213 and return appropriate fault rectification information 106 corresponding to 'Tripping in UPS'. Finally, the fault rectification system 103 provides the fault rectification information 106 received from the one or more databases to user 'A' through the display interface 107.

As shown in FIG. 3A, the fault rectification information 106 corresponding to 'Tripping in UPS' may include a step-wise instruction provided to the user, indicating the user to perform a series of actions for rectifying the tripping in the UPS. In an embodiment, if the user 'A' could not successfully rectify the detected fault event, then the fault rectification system 103 may notify the user 'A' to contact the customer service personnel for proper rectification of the detected fault event.

Alternatively, if there is a complex fault event in the UPS, then the fault rectification system 103 may notify the user 'A' to directly contact a customer service executive for rectifying the fault event, since the rectification may involve complex procedures and demands intensive resources. Suppose, as shown in FIG. 3B, a problem in the UPS may be that the Battery of the UPS is not getting charged and/or is getting drained out quickly. Here, based on continuous monitoring and tracking of the relevant interrupts, the fault rectification system 103 may detect that the fault events responsible for improper functioning of the Battery are because either the Battery is dead or because the Fuses are melted. Since, the detected fault events are complex in nature and involve complex rectification procedures, the fault rectification system 103 may not generate any fault identifier query 213. Instead, the fault rectification system 103 may notify the user to contact the customer service personnel for proper rectification of the detected fault event.

In the above scenario, the fault rectification system 103 may query a data source, such as the data source 105b to dynamically retrieve multimedia such as a video, an audio, or an animation that may be displayed to the user 'A'. Such retrieved multimedia may be rendered on the display interface 107.

Figure 4:
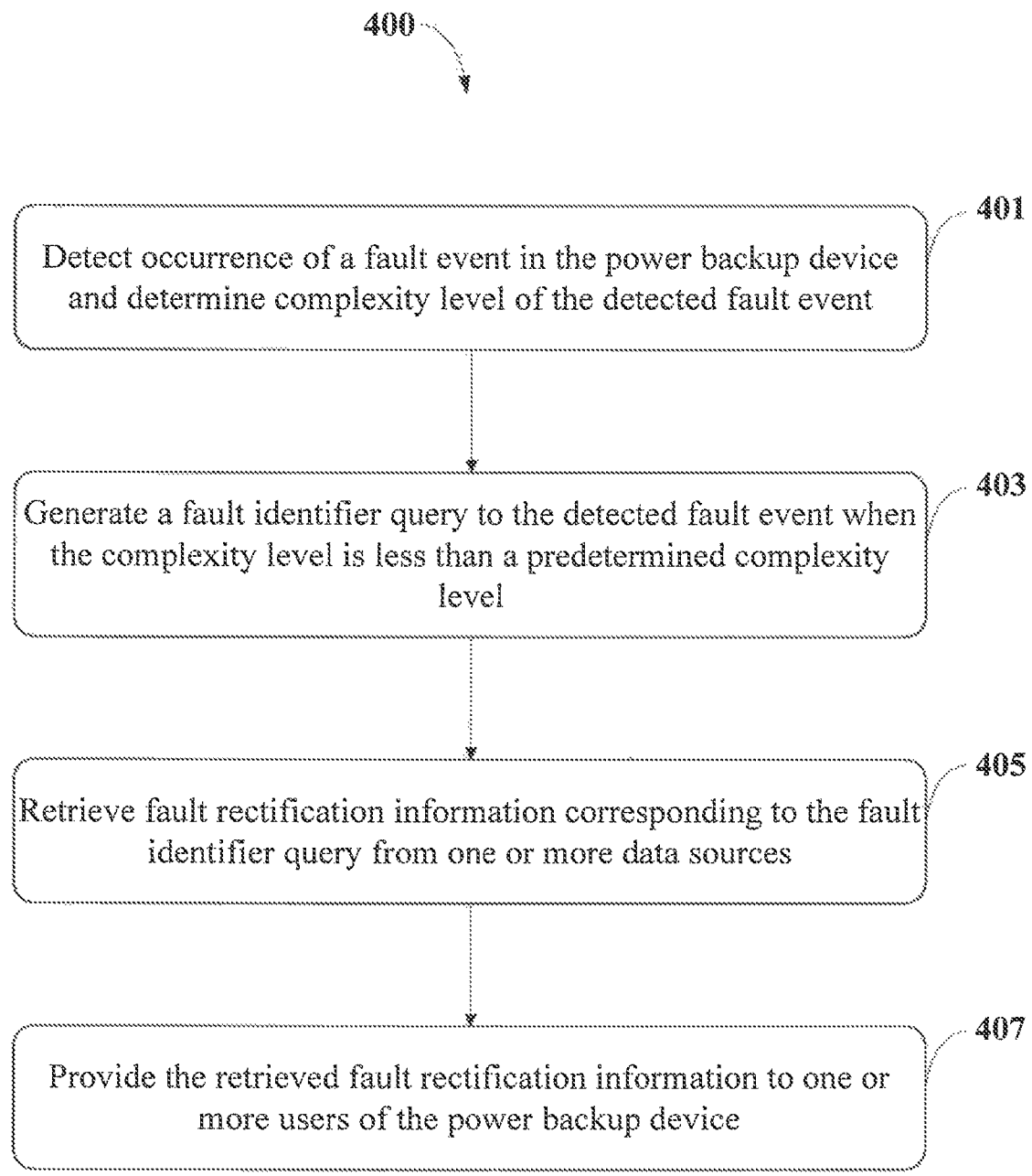
FIG. 4 shows a flowchart illustrating a method for facilitating fault rectification in the power backup devices in accordance with some embodiments of the present disclosure.

FIG. 4 shows a flowchart illustrating a method for facilitating fault rectification in the power backup device 101 in accordance with some embodiments of the present disclosure.

As illustrated in FIG. 4, the method 400 includes one or more blocks illustrating a method for facilitating fault rectification in power backup device 101 using a fault rectification system 103. The method 400 may be described in the general context of computer executable instructions. Generally, computer executable instructions can include routines, programs, objects, components, data structures, procedures, modules, and functions, which perform specific functions or implement specific abstract data types.

The order in which the method 400 is described is not intended to be construed as a limitation, and any number of the described method blocks can be combined in any order to implement the method. Additionally, individual blocks may be deleted from the methods without departing from the spirit and scope of the subject matter described herein. Furthermore, the method can be implemented in any suitable hardware, software, firmware, or combination thereof.

At block 401, method 400 includes detecting, by the fault rectification system 103, occurrence of a fault event in the power backup device 101. Further, the method 400 includes detecting a complexity level of the detected fault event based on one or more pre-configured interrupts. In an embodiment, the fault rectification system 103 may be configured in the power backup device 101.

At block 403, method 400 includes generating, by the fault rectification system 103, a fault identifier query 213 corresponding to the detected fault event when the complexity level of the detected fault event is less than a predetermined complexity level. In an embodiment, the fault identifier query 213 may be generated based on at least one of historical information related to the detected fault event, type of the detected fault event, and fault rectification information 106 previously provided to the one or more users 111 for similar fault events.

At block 405, method 400 includes retrieving, by the fault rectification system 103, fault rectification information 106 corresponding to the fault identifier query 213 from one or more data sources 105, associated with the power backup device 101. The fault rectification information 106 may include information related to rectification of the fault event. In an embodiment, the fault rectification system 103 may notify the one or more users 111 to obtain external assistance for rectifying the detected fault event when the complexity level of the detected fault event is higher than the predetermined complexity level.

At block 407, method 400 includes providing, by the fault rectification system 103, the retrieved fault rectification information 106 to one or more users 111 of the power backup device 101 for facilitating fault rectification in the power backup device 101. In an embodiment, the fault rectification system 103 may provide the fault rectification information 106 on at least one of a display interface 107 configured in the power backup device 101 or one or more preconfigured user devices 109 associated with the one or more users 111.

Computer System

Figure 5:
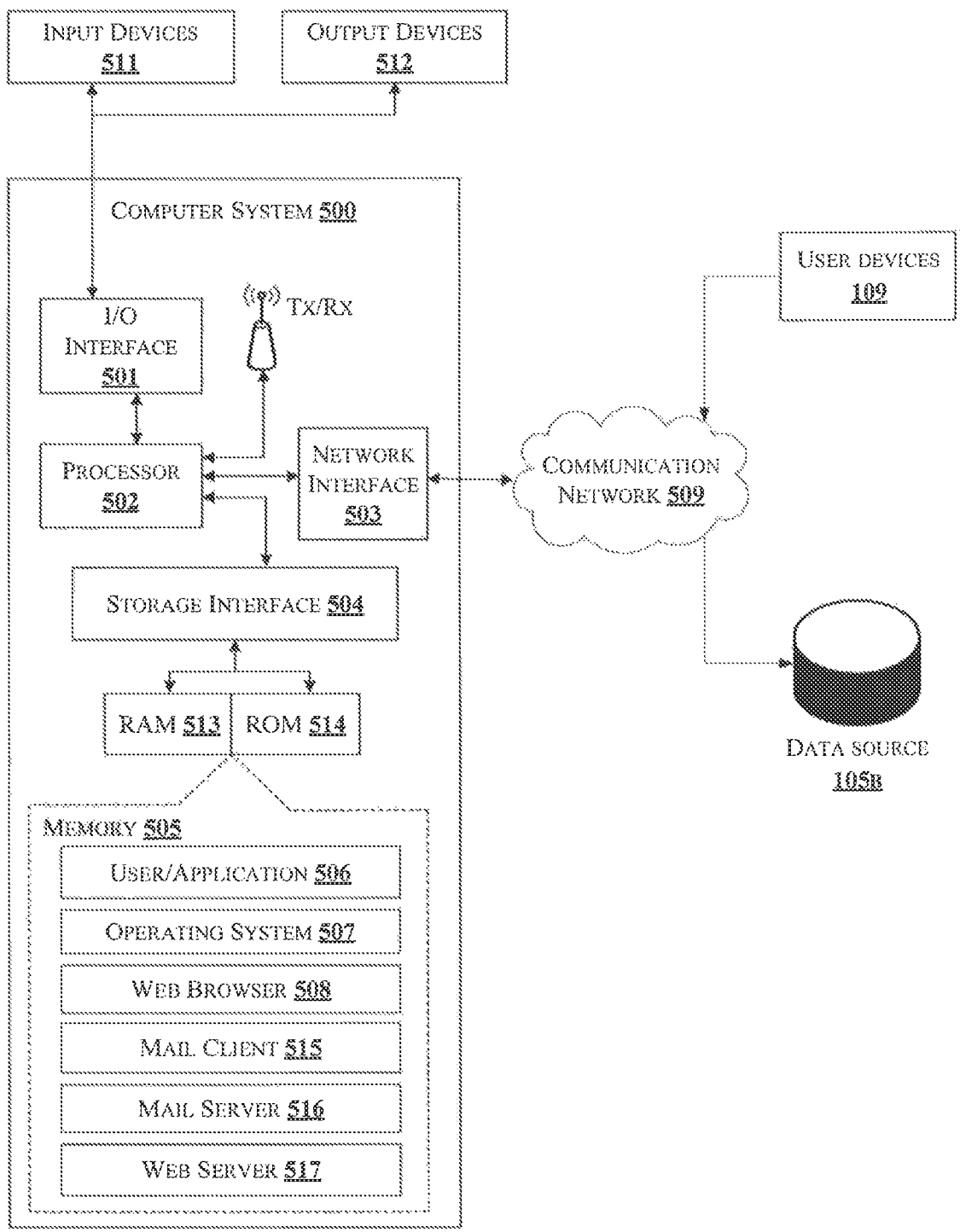
FIG. 5 illustrates a block diagram of an exemplary computer system for implementing embodiments consistent with the present disclosure.

FIG. 5 illustrates a block diagram of an exemplary computer system 500 for implementing embodiments consistent with the present disclosure. In an embodiment, the computer system 500 may be the fault rectification system 103 which is used for facilitating fault rectification in power backup device 101. The computer system 500 may include a central processing unit ("CPU" or "processor") 502. The processor 502 may comprise at least one data processor for executing program components for executing user- or system-generated business processes. A user may include a person, a person using a device such as such as those included in this invention, or such a device itself. The processor 502 may include specialized processing units such as integrated system (bus) controllers, memory management control units, floating point units, graphics processing units, digital signal processing units, etc.

The processor 502 may be disposed in communication with one or more input/output (I/O) devices (511 and 512) via I/O interface 501. The I/O interface 501 may employ communication protocols/methods such as, without limitation, audio, analog, digital, stereo, IEEE-1394, serial bus, Universal Serial Bus (USB), infrared, PS/2, BNC, coaxial, component, composite, Digital Visual Interface (DVI), high-definition multimedia interface (HDMI), Radio Frequency (RF) antennas, S-Video, Video Graphics Array (VGA), IEEE 802.n/b/g/n/x, Bluetooth, cellular (e.g., Code-Division Multiple Access (CDMA), High-Speed Packet Access (HSPA+), Global System For Mobile Communications (GSM), Long-Term Evolution (LTE) or the like), etc.

Using the I/O interface 501, the computer system 500 may communicate with one or more I/O devices (511 and 512). In some embodiments, the processor 502 may be disposed in communication with a communication network 509 via a network interface 503. The network interface 503 may communicate with the communication network 509. The network interface 503 may employ connection protocols including, without limitation, direct connect, Ethernet (e.g., twisted pair 10/100/1000 Base T), Transmission Control Protocol/Internet Protocol (TCP/IP), token ring, IEEE 802.11a/b/g/n/x, etc. Using the network interface 503 and the communication network 509, the computer system 500 may connect to the data source 105b for retrieving fault rectification information 106 corresponding to a fault identifier query 213. Similarly, the computer system 500 may use the communication network 509 to communicate with one or more user devices 109 for providing the fault rectification information 106 related to the detected fault event to the one or more users 111.

The communication network 509 can be implemented as one of the several types of networks, such as intranet or Local Area Network (LAN) and such within the organization. The communication network 509 may either be a dedicated network or a shared network, which represents an association of several types of networks that use a variety of protocols, for example, Hypertext Transfer Protocol (HTTP), Transmission Control Protocol/Internet Protocol (TCP/IP), Wireless Application Protocol (WAP), etc., to communicate with each other. Further, the communication network 509 may include a variety of network devices, including routers, bridges, servers, computing devices, storage devices, etc.

In some embodiments, the processor 502 may be disposed in communication with a memory 505 (e.g., RAM 513, ROM 514, etc. as shown in FIG. 5) via a storage interface 504. The storage interface 504 may connect to memory 405 including, without limitation, memory drives, removable disc drives, etc., employing connection protocols such as Serial Advanced Technology Attachment (SATA), Integrated Drive Electronics (IDE), IEEE-1394, Universal Serial Bus (USB), fiber channel, Small Computer Systems Interface (SCSI), etc. The memory drives may further include a drum, magnetic disc drive, magneto-optical drive, optical drive, Redundant Array of Independent Discs (RAID), solid-state memory devices, solid-state drives, etc.

The memory 505 may store a collection of program or database components, including, without limitation, user/application 506, an operating system 507, web browser 508 etc. In some embodiments, computer system 500 may store user/application 506, such as the data, variables, records, etc. as described in this invention. Such databases may be implemented as fault-tolerant, relational, scalable, secure databases such as Oracle or Sybase.

The operating system 507 may facilitate resource management and operation of the computer system 500. Examples of operating systems include, without limitation, Apple Macintosh OS X, UNIX, Unix-like system distributions (e.g., Berkeley Software Distribution (BSD), FreeBSD, Net BSD, Open BSD, etc.), Linux distributions (e.g., Red Hat, Ubuntu, K-Ubuntu, etc.), International Business Machines (IBM) OS/2, Microsoft Windows (XP, Vista/7/8, etc.), Apple iOS, Google Android, Blackberry Operating System (OS), or the like. A user interface may facilitate display, execution, interaction, manipulation, or operation of program components through textual or graphical facilities. For example, user interfaces may provide computer interaction interface elements on a display system operatively connected to the computer system 500, such as cursors, icons, check boxes, menus, windows, widgets, etc. Graphical User Interfaces (GUIs) may be employed, including, without limitation, Apple Macintosh operating systems' Aqua, IBM OS/2, Microsoft Windows (e.g., Aero, Metro, etc.), Unix X-Windows, web interface libraries (e.g., ActiveX, Java, JavaScript, AJAX, HTML, Adobe Flash, etc.), or the like.

In some embodiments, the computer system 500 may implement a web browser 508. The web browser 508 may be a hypertext viewing application, such as Microsoft Internet Explorer, Google Chrome, Mozilla Firefox, Apple Safari, etc. Secure web browsing may be provided using Secure Hypertext Transport Protocol (HTTPS) secure sockets layer (SSL), Transport Layer Security (TLS), etc. Web browsers may utilize facilities such as AJAX, DHTML, Adobe Flash, JavaScript, Java, Application Programming Interfaces (APIs), etc. In some embodiments, the computer system 500 may implement a mail server stored program component. The mail server 516 may be an Internet mail server such as Microsoft Exchange, or the like. The mail server 516 may utilize facilities such as Active Server Pages (ASP), ActiveX, American National Standards Institute (ANSI) C++/C#, Microsoft .NET, CGI scripts, Java, JavaScript, PERL, PHP, Python, WebObjects, etc. The mail server may utilize communication protocols such as Internet Message Access Protocol (IMAP), Messaging Application Programming Interface (MAPI), Microsoft Exchange, Post Office Protocol (POP), Simple Mail Transfer Protocol (SMTP), or the like. In some embodiments, the computer system 500 may implement a mail client 515. The mail client 515 may be a mail viewing application, such as Apple Mail, Microsoft Entourage, Microsoft Outlook, Mozilla Thunderbird, etc.

Furthermore, one or more computer-readable storage media may be utilized in implementing embodiments consistent with the present invention. A computer-readable storage medium refers to any type of physical memory on which information or data readable by a processor may be stored. Thus, a computer-readable storage medium may store instructions for execution by one or more processors, including instructions for causing the processor(s) to perform steps or stages consistent with the embodiments described herein. The term "computer-readable medium" should be understood to include tangible items and exclude carrier waves and transient signals, i.e., non-transitory. Examples include Random Access Memory (RAM), Read-Only Memory (ROM), volatile memory, nonvolatile memory, hard drives, Compact Disc (CD) ROMs, Digital Video Disc (DVDs), flash drives, disks, and any other known physical storage media.

Advantages of the Embodiment of the Present Disclosure are Illustrated Herein.

In an embodiment, the present disclosure discloses a method of facilitating users of the power backup devices to rectify a fault in the power backup devices without intervention of expert service personnel.

In an embodiment, the method of the present disclosure reduces total turnaround time of rectifying the faults in the power backup devices by eliminating involvement of expert/customer service personnel in the rectification of lesser complex faults.

In an embodiment, the method of the present disclosure helps in detecting the occurrence of faults in the power backup and classifying the detected faults based on complexity level of the faults.

The terms "an embodiment", "embodiment", "embodiments", "the embodiment", "the embodiments", "one or more embodiments", "some embodiments", and "one embodiment" mean "one or more (but not all) embodiments of the invention(s)" unless expressly specified otherwise.

The terms "including", "comprising", "having" and variations thereof mean "including but not limited to", unless expressly specified otherwise.

The enumerated listing of items does not imply that any or all of the items are mutually exclusive, unless expressly specified otherwise.

The terms "a", "an" and "the" mean "one or more", unless expressly specified otherwise. A description of an embodiment with several components in communication with each other does not imply that all such components are required. On the contrary, a variety of optional components are described to illustrate the wide variety of possible embodiments of the invention.

When a single device or article is described herein, it will be clear that more than one device/article (whether they cooperate) may be used in place of a single device/article. Similarly, where more than one device or article is described herein (whether they cooperate), it will be clear that a single device/article may be used in place of the more than one device or article or a different number of devices/articles may be used instead of the shown number of devices or programs. The functionality and/or the features of a device may be alternatively embodied by one or more other devices which are not explicitly described as having such functionality/features. Thus, other embodiments of the invention need not include the device itself.

Finally, the language used in the specification has been principally selected for readability and instructional purposes, and it may not have been selected to delineate or circumscribe the inventive subject matter. It is therefore intended that the scope of the invention be limited not by this detailed description, but rather by any claims that issue on an application based here on. Accordingly, the embodiments of the present invention are intended to be illustrative, but not limiting, of the scope of the invention, which is set forth in the following claims.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

REFERRAL NUMERALS

| Reference Number | Description |
| --- | --- |
| 100 | Environment |
| 101 | Power backup device |
| 103 | Fault rectification system |
| 105 | Data source |
| 106 | Fault rectification information |
| 107 | Display interface |
| 109 | User devices |
| 111 | Users |
| 201 | I/O interface |
| 203 | Processor |
| 205 | Memory |
| 207 | Data |
| 209 | Modules |
| 211 | Complexity level indicator |
| 213 | Fault identifier query |
| 215 | Other data |
| 217 | Event detection module |
| 221 | Query generator module |
| 223 | Fault notification module |
| 225 | Other modules |
| 500 | Exemplary computer system |
| 501 | I/O Interface of exemplary computer system |
| 502 | Processor |
| 503 | Network interface |

-continued

| Reference Number | Description |
| --- | --- |
| 504 | Storage interface |
| 505 | Memory of exemplary computer system |
| 506 | User/Application |
| 507 | Operating system |
| 508 | Web browser |
| 509 | Communication network |
| 511 | Input devices |
| 512 | Output devices |
| 513 | RAM |
| 514 | ROM |
| 515 | Mail client |
| 516 | Mail server |
| 517 | Web server |

What is claimed is:

1. A method of facilitating fault rectification in a power backup device (101), the method comprising:
   detecting, by a fault rectification system (103) configured in the power backup device (101), occurrence of a fault event in the power backup device (101) and complexity level of the detected fault event based on one or more pre-configured interrupts;
   generating, by the fault rectification system (103), a fault identifier query (213) corresponding to the detected fault event when the complexity level of the detected fault event is less than a predetermined complexity level;
   retrieving, by the fault rectification system (103), fault rectification information (106) corresponding to the fault identifier query (213) from one or more data sources (105), associated with the power backup device (101), wherein the fault rectification information (106) comprises information related to rectification of the fault event; and
   providing, by the fault rectification system (103), the retrieved fault rectification information (106) to one or more users (111) of the power backup device (101) for facilitating fault rectification in the power backup device (101).

2. The method as claimed in claim 1, wherein generating the fault identifier query (213) is based on at least one of historical information related to the detected fault event, type of the detected fault event, and fault rectification information (106) previously provided to the one or more users (111) for similar fault events.

3. The method as claimed in claim 1 further comprises notifying the one or more users (111) to obtain external assistance for rectifying the detected fault event, when the complexity level of the detected fault event is higher than the predetermined complexity level.

4. The method as claimed in claim 1, wherein the fault rectification information (106) is provided to the one or more users (111) based on at least one of a video tutorial, an audio tutorial, or a graphical animation based assistance.

5. The method as claimed in claim 1, wherein the fault rectification information (106) is provided on at least one of a display interface (107) configured in the power backup device (101) or one or more preconfigured user devices (109) associated with the one or more users (111).

6. A fault rectification system (103) for facilitating fault rectification in a power backup device (101), the fault rectification system (103) comprising:
   a processor (203); and
   a memory (205) communicatively coupled, to the processor (203), wherein the memory (205) stores processor-executable instructions, which, on execution, causes the processor (203) to:

detect occurrence of a fault event in the power backup device (101) and complexity level of the detected fault event based on one or more pre-configured interrupts;

generate a fault identifier query (213) corresponding to the detected fault event when the complexity level of the detected fault event is less than a predetermined complexity level;

retrieve fault rectification information (106) corresponding to the fault identifier query (213) from one or more data sources (105), associated with the power backup device (101), wherein the fault rectification information (106) comprises information related to rectification of the fault event; and provide the retrieved fault rectification information (106) to one or more users (111) of the power backup device (101) for facilitating fault rectification in the power backup device (101).

7. The fault rectification system (103) as claimed in claim 6 is configured in the power backup device (101).

8. The fault rectification system (103) as claimed in claim 6, wherein the processor (203) generates the fault identifier query (213) based on at least one of historical information related to the detected fault event, type of the detected fault event, and fault rectification information (106) previously provided to the one or more users (111) for similar fault events.

9. The fault rectification system (103) as claimed in claim 6, wherein the processor (203) notifies the one or more users (111) to obtain external assistance to rectify the detected fault event when the complexity level of the detected fault event is higher than the predetermined complexity level.

10. The fault rectification system (103) as claimed in claim 6, wherein the processor (203) provides the fault rectification information (106) to the one or more users (111) based on at least one of a video tutorial, an audio tutorial, or a graphical animation based assistance.

11. The fault rectification system (103) as claimed in claim 6, wherein the processor (203) provides the fault rectification information (106) on at least one of a display interface (107) configured in the power backup device (101) or one or more preconfigured user devices (109) associated with the one or more users (111).

12. A non-transitory computer readable medium including instructions stored thereon that when processed by at least one processor cause a fault rectification system (103) to perform operations comprising:

detecting, by the fault rectification system (103) configured in a power backup device (101), occurrence of a fault event in the power backup device (101) and complexity level of the detected fault event based on one or more pre-configured interrupts;

generating, by the fault rectification system (103), a fault identifier query (213) corresponding to the detected fault event when the complexity level of the detected fault event is less than a predetermined complexity level;

retrieving, by the fault rectification system (103), fault rectification information (106) corresponding to the fault identifier query (213) from one or more data sources (105), associated with the power backup device (101), wherein the fault rectification information (106) comprises information related to rectification of the fault event; and providing, by the fault rectification system (103), the retrieved fault rectification information (106) to one or more users (111) of the power backup device (101) for facilitating fault rectification in the power backup device (101).

\* \* \* \* \*